United States Patent
Giraud et al.

(10) Patent No.: US 8,937,505 B2
(45) Date of Patent: Jan. 20, 2015

(54) INTEGRATED CIRCUIT COMPRISING A CLOCK TREE CELL

(71) Applicants: Commissariat à l'énergie atomique et aux énergies alternatives, Paris (FR); STMicroelectronics SA, Montrouge (FR); STMicroelectronics (Crolles 2) SAS, Crolles (FR)

(72) Inventors: Bastien Giraud, Grenoble (FR); Fady Abouzeid, Grenoble (FR); Sylvain Clerc, Grenoble (FR); Jean-Philippe Noel, Montbonnot Saint Martin (FR); Yvain Thonnart, Grenoble (FR)

(73) Assignees: Commissariat a l'Energie Atomique et aux Energies Alternatives, Paris (FR); STMicroelectronics SA, Mountrouge (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 14/134,081

(22) Filed: Dec. 19, 2013

(65) Prior Publication Data

US 2014/0176228 A1    Jun. 26, 2014

(30) Foreign Application Priority Data

Dec. 26, 2012    (FR) ...................... 12 62811

(51) Int. Cl.
| | |
|---|---|
| *H03K 3/01* | (2006.01) |
| *G05F 3/02* | (2006.01) |
| *H01L 21/84* | (2006.01) |
| *H01L 27/118* | (2006.01) |
| *H01L 27/12* | (2006.01) |
| *H03K 19/177* | (2006.01) |
| *H01L 29/786* | (2006.01) |

(52) U.S. Cl.
CPC *G05F 3/02* (2013.01); *H01L 21/84* (2013.01); *H01L 27/11807* (2013.01); *H01L 27/1203* (2013.01); *H03K 19/1774* (2013.01); *H01L 29/78648* (2013.01)
USPC ........................................................ 327/534

(58) Field of Classification Search
USPC .......................................... 327/534, 574–582
See application file for complete search history.

(56) References Cited

U.S. PATENT DOCUMENTS 7,126,380 B2 * 10/2006 Forbes ........................... 326/93
2006/0027877 A1    2/2006 Inaba

FOREIGN PATENT DOCUMENTS

WO    WO2012/160071    11/2012

OTHER PUBLICATIONS

Noel et al. "UT2B-FDSOI Device Architecture Dedicated to Low Power Design Techniques"; IEEE 210-213 (2010).
Noel et al. "Multi-$V_t$ UTBB FDSOI Device Architectures for Low-Power CMOS Circuit"; IEE Transactions on Electronic Devices; 58(8):2473-2482 (2011).
Pavlidis et al."Clock Distribution Networks for 3-D Integrated Circuits"; IEEE 2008 Custom Integrated Circuits Conference (CICC); 651-654 (2008).

* cited by examiner

*Primary Examiner* — Sibin Chen
(74) *Attorney, Agent, or Firm* — Occhiuti & Rohlicek LLP (57) ABSTRACT

The invention relates to an integrated circuit comprising:
a first semiconductor well (60);
a plurality of standard cells (66), each standard cell comprising a first field-effect transistor in FDSOI technology comprising a first semiconductor ground plane located immediately on the first well; and a clock tree cell (30) contiguous with the standard cells, the clock tree cell comprising a second field-effect transistor in FDSOI technology, which transistor comprises a second semiconductor ground plane located immediately on the first well (60), so as to form a p-n junction with this first well.
The integrated circuit comprises an electrical power supply network (51) able to apply separate electrical biases directly to the first and second ground planes.

12 Claims, 3 Drawing Sheets

INTEGRATED CIRCUIT COMPRISING A CLOCK TREE CELL

RELATED APPLICATIONS

Under 35 USC 119, this application claims the benefit of the priority date of French Patent Application 1262811, filed Dec. 26, 2012, the content of which is herein incorporated by reference.

FIELD OF DISCLOSURE

The invention relates to an integrated circuit, and in particular to an integrated circuit produced on a silicon-on-insulator (SOI) substrate. The invention also relates to a method for using this integrated circuit.

BACKGROUND

SOI technology consists in separating a thin silicon layer (a few nanometers in thickness) from a silicon substrate, using a relatively thick insulating layer (a few tens of nanometers in thickness as a general rule).

Integrated circuits produced in SOI technology have a number of advantages. Such circuits generally have a lower power consumption for an equivalent performance, or a better performance for a given consumption. Such circuits also induce lower parasitic capacitances, making it possible to improve switching speed. In addition, latch up, which is encountered in bulk technology metal-oxide-semiconductor (MOS) transistors, may be prevented. Such circuits therefore prove to be particularly suitable for system on chip (SoC) or microelectromechanical system (MEMS) applications. It has also been observed that SOI integrated circuits are less sensitive to the effects of ionizing radiation and thus prove to be more reliable in applications where such radiation may cause malfunctions, especially space applications. SOI integrated circuits may notably comprise active static random access memory (SRAM) or logic gates.

SUMMARY

Many studies have focused on reducing the static consumption of logic gates while increasing their switching speed. Certain integrated circuits currently being developed incorporate both low-consumption logic gates and fast-access logic gates. To generate these two types of logic gates in a given integrated circuit, the threshold voltage ($V_T$) of certain transistors is decreased to form fast-access logic gates, and the threshold voltage of other transistors is increased to form low-consumption logic gates. In bulk technology, modulation of the threshold voltage level of transistors of the same type is mainly achieved by modifying their channel doping level. However, in FDSOI (fully depleted silicon-on-insulator) technology channel doping is almost inexistent ($10^{15}$ cm$^{-3}$). Thus, the doping level of the channel of the transistors cannot vary substantially, thereby preventing threshold voltages from being modified in this way. One solution proposed in certain studies, in order to produce transistors of the same type with different threshold voltages, is to use different gate materials in these transistors. However, in practice producing such an integrated circuit proves to be technically difficult and economically prohibitive.

In order for different transistors produced in FDSOI technology to have different threshold voltages it is also known to use an electrically biased ground plane (or back plane) placed between a thin insulating oxide layer and the silicon substrate. By adjusting the doping type of the ground planes and their electrical bias, it is possible to improve electrostatic control of these transistors, thereby allowing different ranges of threshold voltage to be defined for these transistors. It is thus possible to produce transistors with a low threshold voltage, termed LVT (for low $V_T$) transistors, transistors with a high threshold voltage, termed HVT (for high $V_T$) transistors, and transistors with an intermediate threshold voltage, termed SVT (for standard $V_T$) or RVT (for regular $V_T$) transistors. Typically, the threshold voltage of LVT transistors is 350 mV or less, that of HVT transistors 500 mV or more, and that of RVT transistors comprised between 350 mV and 500 mV.

Such transistors are for example described in the technical application note by P. Flatresse et al., "Planar fully depleted silicon technology to design competitive SOC at 28 nm and beyond", STMicroelectronics, 2012, available on the website "www.soiconsortium.org".

The state-of-the-art is also described in the following documents:
WO 2012/160071 A1 (CEA);
Jean-Philippe Noel et al. "Multi-VT UTBB FDSOI device architectures for low-power CMOS circuit"; IEEE Transactions on Electron Devices, vol. 58, p. 2473-2482, August 2011; and
US 2006/027877 A1 (INABA).

As is known, synchronous logic integrated circuits require a clock signal to synchronize operation of the logic elements of the circuit. Typically, this clock signal is distributed from a clock signal generator to elements of the circuit, such as registers or switches, by way of a clock tree. This clock tree is a network of electrical interconnects that typically has a tree-like structure, comprising a common trunk, connected to the clock signal generator, dividing into a multitude of branches. Each of these branches may itself divide into a plurality of additional branches.

To ensure correct operation of the circuit, and especially to prevent setup and hold time violations, this clock tree must be carefully configured to limit the appearance of differences in the propagation time of the clock signal (clock skew). For this purpose, the clock tree typically comprises clock tree cells that implement functions optimizing the distribution of the clock signal, such as buffer functions. Thus, each clock tree cell is connected to a branch of the clock tree, and receives an input clock signal from this clock tree. This clock tree cell is also adapted to deliver an output clock signal, able to be distributed to the logic elements of the circuit. In the case where the clock tree cell acts as a buffer, the output clock signal is identical to the input clock signal except that it is delayed by a preset amount of time. These buffers may be adapted, during design of the integrated circuit, to balance the branches of the clock tree and control the appearance of clock skew.

However, integrating such clock tree cells into a circuit comprising standard cells in FDSOI technology with different threshold voltages causes a number of problems. In particular, the clock tree cell must, within each block, be sufficiently isolated from the standard cells to prevent its operation from being affected by the electrical biases applied to the ground plane of these standard cells. Clock tree cells able to be integrated into such a block are known for the 28 nm technology node, but they have a larger footprint than a standard cell. Such an increase in footprint may be prohibitive with a view to the miniaturization requirements of integrated circuits, especially for the 20 nm technology node. Furthermore, such clock tree cells are difficult to integrate, in a given block, with standard cells containing transistors with different threshold voltages.

It would therefore be desirable to provide an integrated circuit comprising transistors in FDSOI technology, this integrated circuit comprising a clock tree cell that is electrically isolated from the standard cells of the circuit, while minimizing the footprint required to integrate this clock tree cell within a block of standard cells comprising transistors with different threshold voltages.

Thus, the invention relates to an integrated circuit according to claim 1.

Here, when it is said that a bias is applied directly to a ground plane, what is meant is that the bias voltage of the ground plane is applied directly to this ground plane without passing via an intermediate well. By choosing, for the clock tree cell, a ground plane with an opposite doping type to the doping of the well, this ground plane forms a p-n junction with the well allowing the clock tree cell to be electrically isolated from adjacent standard cells sharing the same well. Thus, the electrical bias on this ground plane may be electrically isolated from the bias on the ground planes of the transistors belonging to standard cells contiguous with this clock tree cell.

Embodiments of the invention may comprise one or more of the features of claims 2 to 11.

These embodiments furthermore have the following advantages:
  the bias connectors of the ground planes allow an electrical voltage to be applied directly to these ground planes, without having to apply this bias via intermediate wells;
  by choosing, for each ground plane of the clock tree cell, opposite doping types to the wells that make electrical contact with these ground planes, the electrical isolation of the clock tree cell is increased, thereby ensuring the performance of the clock tree is improved; and
  by choosing the doping of the ground planes of the clock tree cell so that one of these ground planes has the opposite doping type to that of the well that makes electrical contact with this ground plane, and another of these ground planes has the same doping type as that of the well that makes electrical contact with this ground plane, what is called partial electrical isolation of the clock tree cell is obtained. This makes it easier to integrate this clock tree cell into a block comprising standard cells employing separate threshold voltages; and
  the single well makes it easier to place standard cells having different threshold voltages side-by-side.

The invention also relates to a method for using an integrated circuit according to claim 12.

BRIEF DESCRIPTION OF THE DRAWINGS

The invention will be better understood on reading the following description, given merely by way of non-limiting example and with reference to the drawings in which.

DETAILED DESCRIPTION

In these figures, the same references are used to denote the same elements.

In the rest of the description, features and functions that are well known in the art will not be described in detail.

Figure 1:
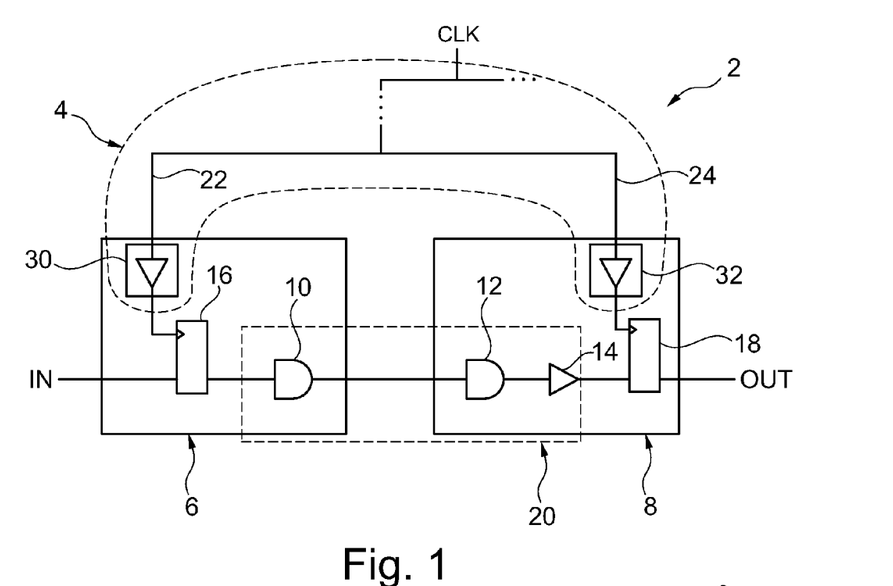
FIG. 1 is a schematic illustration of a portion of an integrated circuit comprising a clock tree.

FIG. 1 shows, in a simplified way, a portion of an integrated circuit 2 containing a clock tree 4. In this example, the circuit 2 comprises blocks 6 and 8 that contain a plurality of logic elements (such as logic gates) and synchronous elements (such as switches) formed from transistors contained in standard cells placed in these blocks 6 and 8. For the sake of simplicity, only three logic elements 10, 12 and 14 are shown. Likewise, only two synchronous elements 16 and 18 are shown. The elements 10, 12 and 14 are connected together in order to form an assembly 20 configured to perform a preset logic function. This assembly 20 is configured to receive an input signal IN, and to deliver an output signal OUT in response to the signal IN. The clock tree 4 is able to transmit a clock signal CLK to the elements 16 and 18 of the circuit 2, such that this signal CLK is received, preferably simultaneously, by these elements 16 and 18, in order to synchronize the operation of the assembly 20 with that of the rest of the circuit 2. In this example, the signal CLK is a periodic square wave signal.

This clock tree 4 is a network of electrical interconnects here taking a tree-like form comprising a plurality of branches. For the sake of simplicity, only two branches 22 and 24 of this tree 4 are shown. In this example, the branch 22 is connected to a clock input of the element 16, and the branch 24 is connected to a clock input of the element 18. In order to limit differences in the propagation time of the signal CLK in the branches 22 and 24, the tree 4 comprises a plurality of clock tree cells. Each of these clock cells is here configured to delay the propagation of the CLK signal by a preset and preferably identical delay time. Thus, selectively adding clock tree cells in the branches of the tree 4 allows these differences in propagation time to be decreased. In this example, only two clock tree cells 30, 32 are shown. For example, these cells 30 and 32 are leaves of the tree 4. These cells 30 and 32 are here inserted into each of the blocks 6 and 8, respectively. These cells 30 and 32 are here structurally identical, except that the cell 30 is located inside the block 6 and the cell 32 is located inside the block 8.

Figure 2:
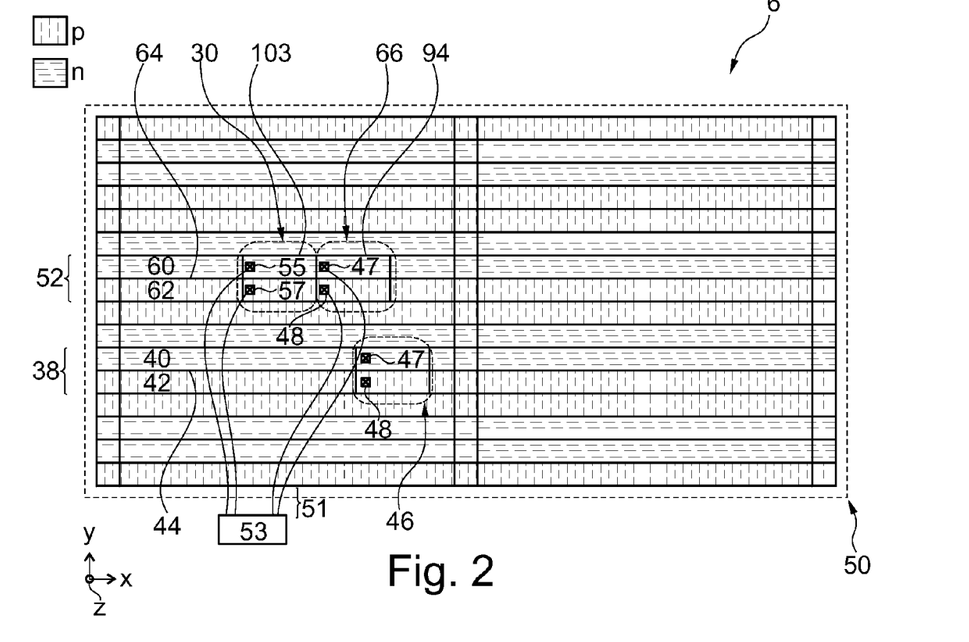
FIG. 2 is a schematic illustration of a longitudinal cross section through a block of the integrated circuit in FIG. 1.

FIG. 2 shows the block 6 of the integrated circuit 2 in greater detail. This circuit 2 comprises:
  a semiconductor substrate 50;
  a plurality of rows of cells; and
  the clock tree cell 30.

The substrate 50 lies essentially in a plane called the "substrate plane". Here, this substrate plane is parallel to orthogonal horizontal directions X and Y. This substrate plane is perpendicular to a vertical direction Z. This substrate plane forms a lower portion of the circuit 2. Here this substrate 50 is p-doped with a doping concentration lower than or equal to $1 \times 10^{16}$ cm$^{-3}$ or $3 \times 10^{15}$ cm$^{-3}$. To simplify FIG. 2 the substrate 50 is represented by a dotted line. Here, this substrate 50 is electrically connected to an electrical ground potential GND of the circuit 2.

Here the rows have a substantially rectilinear shape and all extend, within the block 6, in the X-direction. These rows have the same height, measured in the Y-direction. These rows are placed parallel to one another and are contiguous, pairwise, along one of their edges parallel to the X-direction.

Here, each row comprises:
two semiconductor wells having opposite doping types; and
standard cells placed next to one another along this row.

In this example, the rows of block 6 are placed in a flipped row configuration: the positions of the wells are permutated from one row to the other in the Y-direction, such that two contiguous wells, and respectively belonging to two contiguous rows, have the same doping.

For the sake of simplicity, only a single row 38 is described in detail. The other rows are substantially identical, except that wells having opposite doping types are permutated in alternation from one row to the other.

This row 38 comprises:
two semiconductor wells 40 and 42 that are of opposite doping type and separated from each other by a deep trench isolation 44; and
a plurality of standard cells, placed next to one another in the row 38.

These standard cells are placed next to one another along the X-direction. Here, these standard cells each have a substantially rectangular shape and are the same height as the rows. For the sake of simplicity, a single standard cell 46 is shown in this row 38. These standard cells are separated from each other by trench isolation 45. On the edge where the cells 46 touch each other, the trench isolation 45 is common to these cells. This cell 46 comprises bias connectors 47 and 48 that will be described in greater detail with reference to FIG. 3.

The wells 40 and 42 are placed next to one another in a given plane, called the "well plane", parallel to the substrate plane. These wells 40 and 42 each lie in this well plane, parallel to the X-direction. Here, these wells 40 and 42 are located above the substrate 50.

In this example, the well 40 is n-doped. The well 42 is p-doped. The wells 40 and 42 have a doping concentration comprised between $10^{16}$ and $10^{19}$ cm$^{-3}$.

The trench 44 extends parallel to the X-direction, contiguously with the wells 40 and 42, and over the entire length of these wells. The trench 44 is described in greater detail with reference to FIG. 3, under the reference 64.

Advantageously, the circuit 2 comprises:
an electrical power supply network 51; and
an electrical power source 53 able to deliver electrical voltages to the network 51.

The block 6 also comprises a row 52. The row 52 is, for example, identical to the row 38, except that it comprises, in addition to standard cells, the cell 30. In FIG. 2, in the row 52:
the wells corresponding to the wells 40 and 42 bear the references 60 and 62, respectively;
the trench isolation corresponding to the trench isolation 44 bears the reference 64; and
the standard cells bear the reference 66. For the sake of simplicity, only one standard cell 66, contiguous with the cell 30, has been shown.

Here, cells are said to be "contiguous" if they are separated from one another only by a trench isolation, typically a deep trench isolation.

Everything described with reference to row 38 applies to row 52.

The cell 30 (FIG. 2) is able to receive an input clock signal, and to transmit an output clock signal to a cell 66 of the block 6. Here, the input signal is the clock signal CLK. This cell 30 is contiguous with standard cells. The cell 30 is for example placed in row 52 contiguously with the cell 66, so that the wells 60 and 62 extend under the cell 30. The cell 30 furthermore comprises contact connectors 55 and 57 that are identical to the connectors 47 and 48, respectively.

Figure 3:
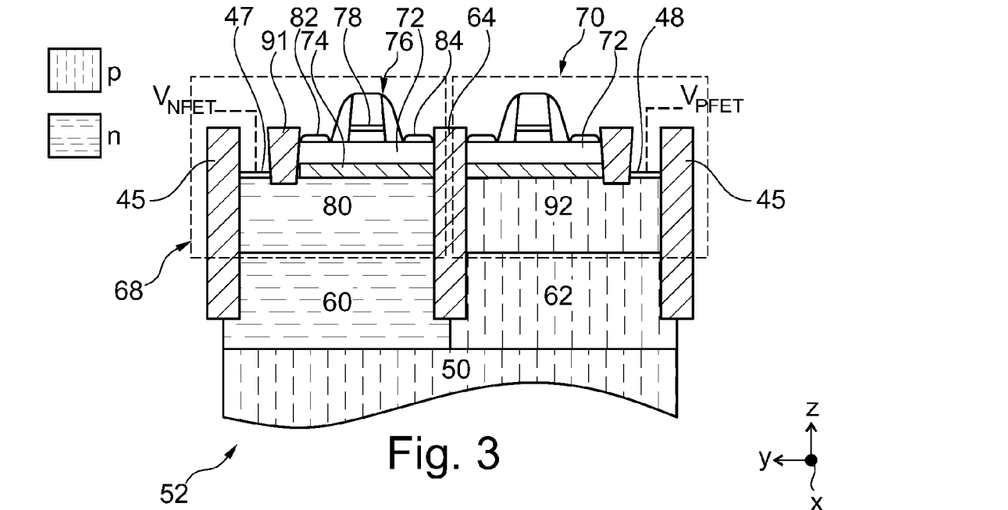
FIG. 3 is a schematic cross-sectional view of a standard cell of the block in FIG. 1.

FIG. 3 shows the cell 66 in greater detail. Typically, each cell here comprises two transistors, the drain of one of these transistors being electrically connected directly to the source of the other transistor of the same cell. In the rest of this description, to simplify the figures, this electrical connection between the two transistors of a given cell has not been shown. The cell 66 comprises two metal-oxide-semiconductor (MOS) field-effect transistors 68 and 70 placed next to each other in the Y-direction. These transistors 68 and 70 are produced in fully depleted silicon-on-insulator technology. The transistors 68 and 70 are placed plumb with the wells 60 and 62, respectively.

Thus, the transistor 68 comprises:
a semiconductor layer 72, called the active layer;
a buried layer 74 of electrically insulating material, located under the layer 72;
a gate multilayer 76, located on the layer 72 and especially comprising a gate 78; and
a semiconductor ground plane 80 located under the layer 74 and immediately on the well 60, so as to make electrical contact with this well 60.

The layer 72 forms a channel between a source 82 and a drain 84. As is known, in FDSOI technology this layer 72 is fully depleted and has a very low doping level, typically lower than or equal to $10^{15}$ cm$^{-3}$. This layer 72 is smaller than or equal to 10 nm in thickness, and preferably smaller than or equal to 8 nm in thickness.

In this description, thickness and depth are defined relative to the Z-direction. Depth is defined relative to a horizontal reference plane passing, for example, through the layer 74.

The layer 74 electrically isolates the layer 72 from the ground plane 80. This layer 74 extends substantially parallel to the substrate plane. The layer 74 is here an ultra-thin buried oxide layer (UTBOX) and is smaller than 40 nm in thickness, and preferably smaller than or equal to 25 nm in thickness. This layer 74 is made of an electrically insulating material. The expression "electrically insulating material" is here understood to mean a material the electrical resistivity of which, at a temperature of 20° C., is higher than or equal to $10^5$ Ω·m or to $10^6$ Ω·m. Here, this layer 74 is made of silicon oxide ($SiO_2$).

The ground plane 80 allows the electrostatic properties of the transistor 68 to be controlled by applying an electrical potential to this ground plane 80 via the connector 47. This connector 47 is able to electrically bias the ground plane 80, when an electrical bias is applied to this connector 47 by a voltage source. For this purpose, the connector 47 makes direct electrical contact with the ground plane 80. This connector 47 for example comprises a trench extending as far as the ground plane 80 and containing an electrically conductive material such as a metal.

In this description, two elements are said to make direct contact if they are in immediate physical contact with each other and if no other element of different nature is interposed between these two elements.

The connector 47 is separated and electrically isolated from the layer 72 by a shallow trench isolation 91. The trench isolation 91 extends, in the Z-direction, from the upper surface of the layer 72 to, for example, a depth larger than or equal to 20 or 30 nm under the layer 74. This depth is smaller than the depth of the trench isolation 64. This trench isolation 91 is made of an electrically insulating material such as silicon oxide.

In this example, the ground plane 80 has the same doping type as the doping of the well 60. The doping concentration of the ground plane 80 is here comprised between $10^{18}$ and $10^{20}$ cm$^{-3}$. This ground plane 80 has a thickness comprised between 50 nm and 300 nm, and preferably between 70 nm and 200 nm. The ground plane 80 and the well 60 are here fabricated from one and the same semiconductor material in separate ion implantation steps. Here, each of the ground plane 80 and the well 60 have a separate doping profile.

In this example, the transistor 68 is an nMOS transistor. The source 82 and the drain 84 are produced above the layer 72. Here, this transistor 68 has a low threshold voltage i.e. it is an LVT (low $V_T$) transistor.

The transistor 70 is similar to the transistor 68, except that:
the transistor 70 is a pMOS transistor;
the ground plane 80 is replaced by a semiconductor ground plane 92 located only above, and plumb with, the well 62, and having the same doping type as the doping of this well 62; and
the contact connector 47 is replaced by a connector 48 identical to the connector 47 except that it makes direct electrical contact with the ground plane 92.

For example, apart from the above differences, everything that was described with reference to the transistor 68 applies to the transistor 70.

The cell 66 comprises, in addition to the trench isolation 64, the trench isolation 45, in order to electrically isolate the transistors of this cell 66 from the transistors of other contiguous cells. The expression "isolate the transistors" is especially understood to mean that the ground planes of these transistors are electrically isolated from each other. More specifically, the trench isolation 45 allows the transistors 68, 70 to be electrically isolated from standard cells adjacent to the cell 66. For this purpose, the trench isolation 45 encircles, in a horizontal plane, the cell 66 over its entire external perimeter.

The trench isolation 64 allows the transistors 68 and 70 of a given cell 66 to be electrically isolated from each other. In this example, the trench isolation 64 is located between the transistors 68 and 70.

These trench isolations 64 and 45 each extend, in the Z-direction, from the upper surface of the layer 72 as far as a lower end located inside the well plane and here having one and the same depth. These trench isolations 64 and 45 are, for example, made of the same material as the trench isolation 91.

Figure 4:
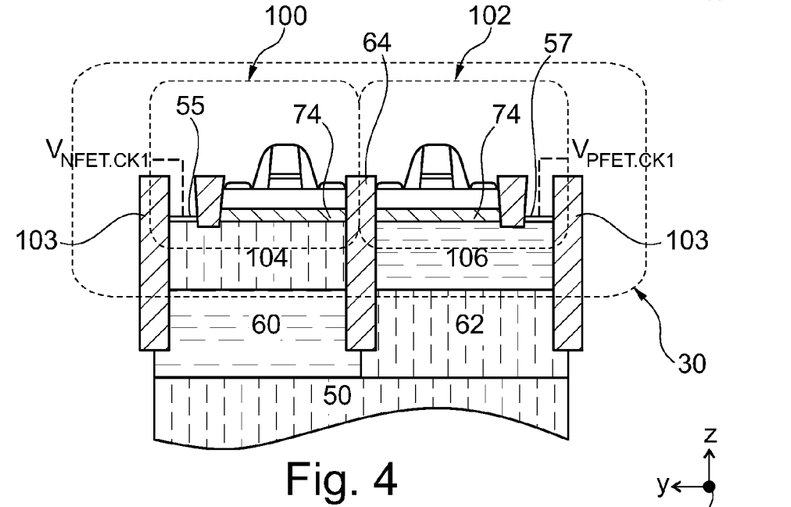
FIG. 4 is a schematic cross-sectional view of a clock tree cell of the block in FIG. 2.

FIG. 4 shows the cell 30 in greater detail. This cell 30 is identical to the cell 66, except that:
the transistors 68 and 70 are replaced by transistors 100 and 102, respectively; and
the trench isolation 45 bears the reference 103.

These transistors 100, 102 are themselves identical to the transistors 68 and 70, except that the ground planes 80 and 92 are replaced by semiconductor ground planes 104 and 106.

For example, the ground planes 104 and 106 are fabricated on the wells 60 and 62, in the same way as the ground planes 80 and 92.

Here, the trench isolation 103 of the cell 30 is common with the trench isolation 45 of the cell 66 immediately adjacent to the cell 30.

The doping of the ground planes 104 and 106 is of opposite type to that of the wells 60 and 62, and therefore of opposite type to that of the ground planes 80 and 92 of the cell 66. The biases applied to these ground planes are chosen such as to allow leakage currents resulting from the formation of forward biased p-n junctions between the ground planes 104, 106 and 80, 92, via the wells 60 and 62, to be prevented. Thus, the electrical biases on the ground planes 104 and 106 are not subject to electrical interference from the electrical biases applied to the ground planes 80 and 92.

The network 51 is able to apply separate electrical biases to the ground planes 80 and 92, 104 and 106. To do this, this network 51 is here electrically connected to the connectors 47, 48, 55 and 57 by electrical connections that are isolated from one another.

This biasing of the ground planes 104 and 106 allows the electrostatic properties of the transistors 100 and 102 to be controlled. This control especially allows asymmetry between the electrical properties of the transistors 100 and 102 to be dynamically compensated.

Specifically, the transistors 100 and 102 of the cell 30 here form a CMOS (complementary metal oxide semiconductor) logic element. The transistors 100 and 102 here have a beta ratio chosen so that the rise time and fall time of the output clock signal transmitted by this cell 30 are substantially equal.

Modification of this beta ratio, creating what is called an asymmetry between the transistors of a given clock tree cell, may adversely affect the behaviour of the tree 4. This asymmetry may depend on uncontrollable and/or unpredictable parameters, such as the operating environment of the circuit 2 (temperature for example), or random variations in the fabrication process of the circuit 2.

In addition, since the cell 30 is substantially identical to the cell 66, it is the same size as the cell 66. Thus, the cell 30 has the same footprint on the circuit 2 as a standard cell.

An example of how the circuit 2 is operated will now be described, with reference to the method in FIG. 5.

In a step 110, the circuit 2 is provided. This circuit is, for example, started up and supplied with power by an electrical voltage source.

Next, in a step 112, electrical biases $V_{PFET}$ and $V_{NFET}$ are applied to the ground planes 92 and 80, respectively.

In a step 114, electrical biases $V_{PFET\_CK1}$ and $V_{NFET\_CK1}$ are applied, at the same time as the biases $V_{PFET}$ and $V_{NFET}$, to the ground planes 106 and 104, respectively.

Here, these biases $V_{PFET}$ and $V_{NFET}$, $V_{PFET\_CK1}$ and $V_{NFET\_CK1}$ are applied by the network 51. The biases $V_{PFET\_CK1}$ and $V_{NFET\_CK1}$ are higher than or equal to $V_{PFET}$ and lower than or equal to $V_{NFET}$, respectively, in order to reverse bias the p-n junctions formed between the ground plane 104 and the well 60, and the ground plane 106 and the well 62, respectively. Here, these biases $V_{PFET}$ and $V_{NFET}$ are both equal to the ground potential GND of the circuit.

Figure 6:
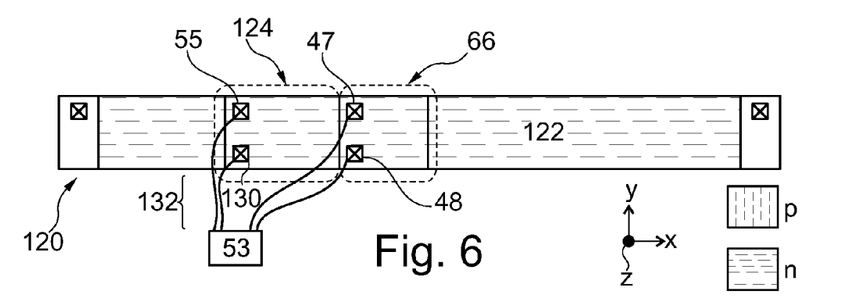
FIG. 6 is a schematic illustration of a longitudinal cross section through another embodiment of a row of the block in FIG. 2.

FIG. 6 illustrates a row 120 of the block 6, able to be used instead of the row 52. This row 120 is identical to the row 52, except that:
the wells 60 and 62 are replaced by a single well 122;
the cell 30 is replaced by a clock tree cell 124; and
the bias connector 57 is replaced by an identical connector, which bears the reference 130.

In this example, the respective wells of each of the other rows of the block 6 are also replaced by a single well specific to each of these rows. The doping type of contiguous wells alternates in the Y-direction.

The network 51 is replaced by a network 132 electrically connected to the connectors 47, 48, 55 and 130.

The well 122 advantageously has a doping type and a doping concentration identical to either one of the wells 60 and 62. Here, the well 122 is identical to the well 60 and is therefore n-doped.

Figure 7:
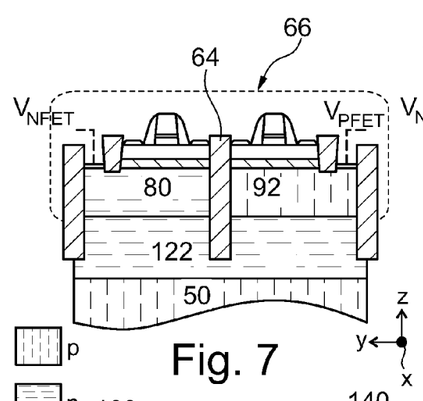
FIG. 7 is a schematic cross-sectional view of another embodiment of the cell in FIG. 3.

FIG. 7 shows, in greater detail, the cell 66 placed in this row 120. The ground planes 80 and 92 of the cell 66 both make direct electrical contact with this well 122.

Figure 8:
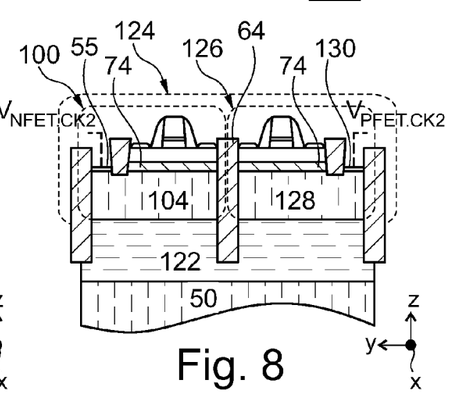
FIG. 8 is a schematic cross-sectional view of another embodiment of the cell in FIG. 4.

FIG. 8 shows the cell 124 in greater detail. This cell 124 is identical to the cell 30, except that the transistor 102 is replaced by a transistor 126. The transistor 126 is identical to the transistor 102, except that the ground plane 106 is replaced by an oppositely doped ground plane 128.

The ground planes 104 and 128 thus have the same doping, of the opposite type to the doping of the well 122.

With this choice of doping, the ground planes 104 and 128 of the cell 124 may be biased so as to electrically isolate the transistors 100 and 126 from the transistors 68 and 70 of the contiguous cell 66 (FIG. 7). The single well 122 allows standard cells having different types of threshold voltages to be placed contiguous with one another in the row 120.

Figure 9:
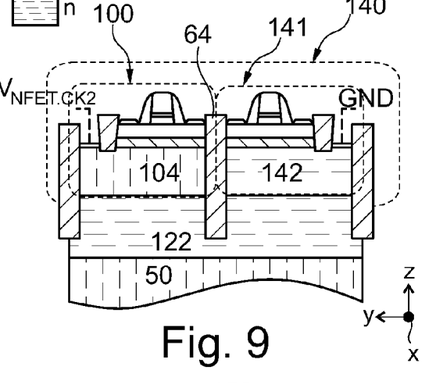
FIG. 9 is a schematic cross-sectional view of another embodiment of the cell in FIG. 4 or 8.

FIG. 9 shows a cell 140 able to replace the cell 124. This cell 140 is identical to the cell 124, except that the transistor 126 is replaced by a transistor 141. The transistor 141 is identical to the transistor 126, except that the ground plane 128 is replaced by an oppositely doped ground plane 142. For example, this ground plane 142 is identical to the ground plane 106. Thus, the ground planes 104 and 142 have opposite doping types. The doping of the ground plane 142 is of the same type as the doping of the well 122.

With this choice of doping types, by adjusting the bias on the ground plane 104, the transistor 100 may be electrically isolated from the contiguous cell 66 in the same row 120 (FIG. 7), but the ground plane 142 of the cell 140 is not. This ground plane 142 is here able to be brought to the same electrical potential as the ground plane 80 of the contiguous cell 66 by way of the well 122. The cell 140 is said to be partially isolated.

Figure 5:
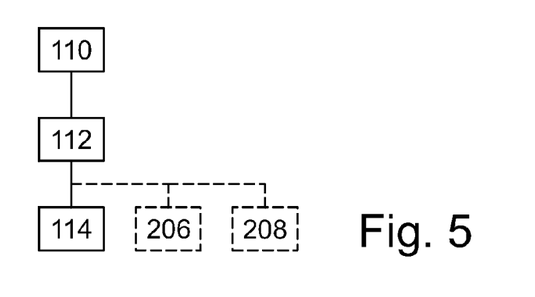
FIG. 5 is a flowchart of a method for using the circuit in FIG. 1.

Operation of the cells 124 and 140 is identical to the operation of the cell 30, except that step 114 is replaced by a step 206, shown in dotted lines in FIG. 5. In this step 206, an electrical bias $V_{PFET\_CK2}$ is applied to the ground planes 128 or 142. A bias $V_{NFET\_CK2}$ is applied to the ground plane 104. These biases $V_{PFET\_CK2}$ and $V_{NFET\_CK2}$ are here higher than or equal to the bias applied to the well 122, in order to reverse bias the p-n junction formed between the ground plane 104 and the well 122. For this purpose, these biases $V_{PFET\_CK2}$ and $V_{NFET\_CK2}$ are here higher than or equal to the ground potential GND.

Figure 10:
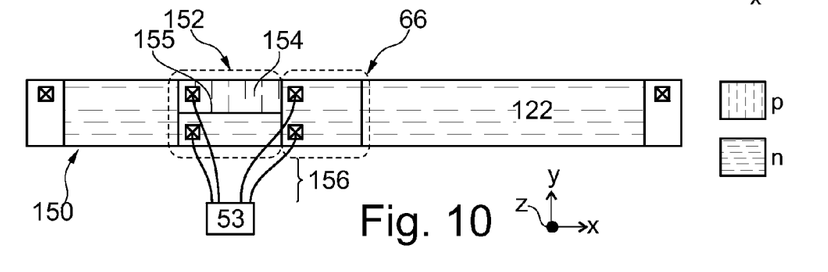
FIG. 10 is a schematic longitudinal cross-sectional view of another embodiment of the row in FIG. 6.

FIG. 10 shows a row 150 of cells able to replace the row 52 or 120. This row 150 contains standard cells and a clock tree cell 152. In FIG. 9, only the standard cell 66 has been shown. This row 150 is identical to the row 120, except that half of the well 122, located only under the cell 152, is replaced by an oppositely doped well 154. This well 154 is, for example, identical to the well 62, except that it lies only under the cell 152. Under the cell 152, these wells 122 and 154 extend parallel to each other in the X-direction. These wells 122 and 154 are here separated by a deep trench isolation 155 that is identical to the trench isolation 64, except that it extends only in the cell 152. The network 132 is replaced by a network 156 identical to the network 132 except that it is electrically connected to the connectors 47, 48 and to the connectors of the cell 152.

Figure 11:
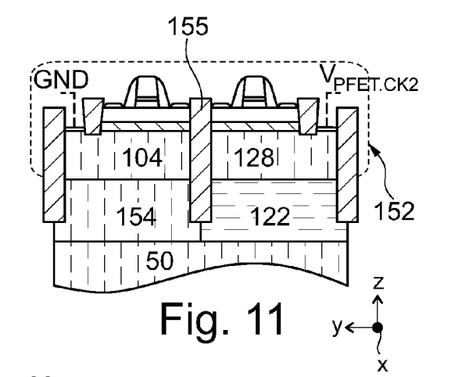
FIG. 11 is a schematic cross-sectional view of another embodiment of the cell in FIG. 4 or 8.

FIG. 11 shows the cell 152 in greater detail. This cell 152 contains transistors the ground planes of which have the same doping type. This cell 152 is, for example, identical to the cell 124.

The cell 152 is operated in an identical way to the way in which the cell 140 is operated, except that step 206 is replaced by a step 208, shown in dotted lines in FIG. 5. This step is identical to step 206, except that the electrical bias $V_{PFET\_CK2}$ is applied to the ground plane 128 in order to reverse bias the p-n junction formed between the ground plane 128 and the well 122.

Many other embodiments are possible.

The circuit 2 illustrated in FIG. 1 may be different from the example illustrated and may especially comprise more logic and/or synchronous elements. The assembly 20 may have more than one input IN and/or more than one output OUT.

The rows of the block 6 may have a different configuration. For example, the rows may be placed in what is called a regular configuration (i.e. not a flipped configuration). Specifically, the wells may be identically arranged in each of the rows of block 6.

In another variant, the cells placed next to one another in a block do not form parallel rows. In this case, for example, the height of the cells in the Y-direction is not the same for all the cells of a given block of contiguous cells. Wells common to a plurality of contiguous cells are not then necessarily rectilinear, and may adopt a wide variety of shapes. Such a cell arrangement is, for example, employed in logic circuits. However, the above description regarding the case where the cells are aligned in rows also applies to these cases where such rows do not exist.

The cell 30 may provide a function other than a buffer function. The cell 30 may, for example, be adapted to amplify the input clock signal.

The substrate 50 may be n-doped.

The source 53 may be omitted. In this case, the network 51 is electrically connected to an electrical power source located outside of the circuit 2.

As a variant, the trench isolation 64 of the cells 124 and/or 152 is replaced by a shallow trench isolation, for example identical to the trench isolation 91. This shallow trench isolation allows the active layer 72 to be isolated from each of the transistors 100 and 126, but does not electrically isolate the ground planes 104 and 128 from each other. In this case, these ground planes 104 and 128 may be biased with a given electrical potential using a single contact connector. Either one of the connectors 55 and 130 may then be omitted.

The cell 66 may comprise more than two transistors 68 and 70.

As a variant, the transistors of the standard cells may have an intermediate threshold voltage (RVT). For this purpose, the respective ground planes of these transistors may be replaced by ground planes having an opposite doping type (p-type doping under nMOS transistors and n-type doping under pMOS transistors). For example, the doping types of the ground planes 80 and 92 of the cell 66 are permutated. In this case, the doping types of the ground planes 104 and 106 of the cell 30, and those of the wells 60 and 62, are then permutated. The bias $V_{PFET}$ is then chosen to be equal to a supply voltage VDD of the circuit 2 under nominal biasing. The biases $V_{PFET\_CK1}$ and $V_{NFET\_CK1}$ are, in this case, chosen to be lower than or equal to the voltage VDD, and higher than or equal to the ground potential GND, respectively.

As a variant, the source 82 and the drain 84 are not formed on the layer 72 but are formed inside this layer 72, or even inside and on top of this layer 72, for example by epitaxy.

The row 120, comprising the well 122, may be used within the block 6 instead of the row 38. The same is true for the row 150.

The well 122 may be p-doped. In this case, the ground planes 104 and 128 of the cells 124 and 152 are replaced by oppositely doped ground planes. The biases $V_{PFET\_CK2}$ and $V_{NFET\_CK2}$ are, in this case, chosen to be higher than or equal to the ground potential GND.

The biases $V_{NFET}$ and $V_{PFET}$ may be modulated by a variable electric potential $\Delta V$, for example in order to apply a reverse back bias (RBB) or a forward back bias (FBB). The same is true for the biases $V_{PFET\_CK1}$ and $V_{NFET\_CK1}$, and $V_{PFET\_CK2}$ and $V_{NFET\_CK2}$.

The invention claimed is:

1. Integrated circuit, comprising:
  a semiconductor substrate lying essentially in a plane called the substrate plane;
  a first semiconductor well lying in a plane called the well plane parallel to the substrate plane;
  a plurality of standard cells placed next to one another, each standard cell comprising a first field-effect transistor in FDSOI technology, the first transistor comprising a first semiconductor ground plane located immediately on the first well so as to make electrical contact with the first well, the first well thus being common to all the standard cells placed next to one another;
  a clock tree cell contiguous with the standard cells, the clock tree cell comprising a second field-effect transistor in FDSOI technology, the second transistor comprising a second semiconductor ground plane located immediately on the first well so as to form a p-n junction with this first well, this second ground plane having, for this purpose, an opposite doping type to the doping of the first well; and
  an electrical power supply network able to apply separate electrical biases directly to the first and second ground planes.

2. Circuit according to claim 1, in which the circuit comprises a power source adapted to be electrically connected to the electrical power supply network and able to apply separate electrical biases to the first and second ground planes.

3. Circuit according to claim 1, in which the clock tree cell comprises a trench isolation (45), made of an electrically insulating material, encircling the second ground plane in a plane parallel to the substrate plane.

4. Circuit according to claim 1, in which each standard cell and clock tree cell comprises, for each ground plane of this cell, at least one first connector adapted to make direct electrical contact with said ground plane, this first connector being able to electrically bias said ground plane with an electrical bias delivered by an external voltage source.

5. Circuit according to claim 1, in which each ground plane of each transistor of the clock cell has an opposite doping type to the doping of the well on which this transistor is located.

6. Circuit according to claim 5, in which:
  the circuit comprises a second semiconductor well contiguous with the first well and extending parallel to the first well in the well plane, the second well having an opposite doping type to the doping of the first well;
  each standard cell includes a third field-effect transistor in FDSOI technology, this third transistor comprising a third ground plane located immediately on the second well so as to make electrical contact with this second well, the second well thus being common to all the standard cells placed next to one another on the first well, the first and third ground planes having the same doping type as the doping of the first and second wells, respectively; and
  the clock tree cell includes a fourth field-effect transistor in FDSOI technology, this fourth transistor comprising a fourth ground plane located immediately above the second well so as to form a p-n junction with this second well, this fourth ground plane having an opposite doping type to the doping of the second well.

7. Circuit according to claim 1, in which:
  the first ground plane has the same doping type as the doping of the first well;
  each standard cell includes a third field-effect transistor in FDSOI technology, this third transistor comprising a third ground plane located immediately on the first well so as to make electrical contact with this first well, the third ground plane having an opposite doping type to the doping of the first ground plane, the first well thus being common to all the transistors of the standard cells placed next to one another on the same first well;
  the clock tree cell includes a fourth field-effect transistor in FDSOI technology, the fourth transistor comprising a fourth ground plane located immediately above the first well so as to form a p-n junction with this first well, this fourth ground plane having, for this purpose, the same doping type as the second and third ground planes.

8. Circuit according to claim 7, in which the second and fourth ground planes of the clock tree cell make electrical contact with each other, so that it is possible to bias these second and fourth ground planes with one and the same electrical potential by applying an electrical bias to only one of these second and fourth ground planes.

9. Circuit according to claim 1, in which:
  each standard cell includes a third field-effect transistor in FDSOI technology, this third transistor comprising a third ground plane located immediately above the first well so as to make electrical contact with this first well, the first well thus being common to all the transistors of the standard cells placed next to one another on the same first well, the third ground plane having an opposite doping type to the doping of the first ground plane; and
  the clock tree cell includes a fourth field-effect transistor in FDSOI technology, this fourth transistor comprising a fourth ground plane located immediately above the first well so as to make electrical contact with this first well, and having an opposite doping type to the doping of the second ground plane.

10. Circuit according to claim 1, in which:
  the circuit comprises a second well contiguous with the first well and having an opposite doping type to the doping of the first well;
  the standard cell includes a third field-effect transistor in FDSOI technology, the third transistor comprising a third ground plane located immediately above the second well so as to make electrical contact with this second well, and having an opposite doping type to the doping of the first ground plane; and
  the clock tree cell includes a fourth field-effect transistor in FDSOI technology, this fourth transistor comprising a fourth ground plane located immediately above the second well so as to make electrical contact with this second well, and having the same doping type as the doping of the second ground plane.

11. Circuit according to claim 1, in which the circuit comprises a plurality of rows of cells placed parallel to one another on the substrate, each row including at least one example of the first well and a plurality of standard cells, which cells are placed next to one another in this row, one of these rows, called the middle row, comprising the clock tree cell contiguous with the standard cells.

12. Method for using an integrated circuit, comprising the following steps:
  providing an integrated circuit according claim 1;
  applying a first electrical bias to the first ground plane;

applying a second electrical bias to the second ground plane, the second bias being chosen depending on the first electrical bias applied at the same time to the first ground plane, so as to reverse bias the p-n junction formed between the second ground plane and the first well.

* * * * *